(12) United States Patent
Erben et al.

(10) Patent No.: US 7,102,802 B1
(45) Date of Patent: Sep. 5, 2006

(54) METHODS FOR STORING HOLOGRAPHIC DATA AND ARTICLES HAVING ENHANCED DATA STORAGE LIFETIME DERIVED THEREFROM

(75) Inventors: Christoph Georg Erben, Clifton Park, NY (US); Eugene Pauling Boden, Scotia, NY (US); Xiaolei Shi, Niskayuna, NY (US); Kathryn Lynn Longley, Saratoga Springs, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 11/359,958

(22) Filed: Feb. 22, 2006

(51) Int. Cl.
*G03B 31/00* (2006.01)
*G11B 5/633* (2006.01)

(52) U.S. Cl. .................. 359/3; 359/4; 430/1
(58) Field of Classification Search ............... 359/3–4; 430/1–2
See application file for complete search history.

(56) References Cited

U.S. PATENT DOCUMENTS 3,850,633 A * 11/1974 Moraw et al. ............... 430/1
2005/0136333 A1   6/2005 Lawrence et al.

OTHER PUBLICATIONS

Copending U.S. Appl. No. 10/954,779, filed Sep. 30, 2004, entitled "Holographic Storage Medium".
Copending U.S. Appl. No. 11/260,806, filed Oct. 27, 2005, entitled "Methods for Making Holographic Data Storage Artciels".
Copending U.S. Appl. No. 11/296,246, filed Dec. 7, 2005, entitled "Methods for Storing Holographic Data and Articles Having Enhanced Data Storage Lifetime Derived Therefrom".

* cited by examiner

*Primary Examiner*—Leonidas Boutsikaris
(74) *Attorney, Agent, or Firm*—Andrew J. Caruso; William E. Powell, III

(57) ABSTRACT

The present invention provides a method for storing holographic data comprising providing an optically transparent substrate comprising a photochemically active dye; irradiating the optically transparent substrate with a holographic interference pattern, wherein the pattern has a first wavelength and an intensity both sufficient to convert, within a volume element of the substrate, at least some of the photochemically active dye into a photo-product, producing within the irradiated volume element concentration variations of the photo-product corresponding to the holographic interference pattern, thereby producing a first optically readable datum corresponding to the volume element; activating the optically transparent substrate to form an intramolecular hydrogen bond to a nitrone oxygen in residual photochemically active dye, to stabilize the optically readable datum.

25 Claims, No Drawings

METHODS FOR STORING HOLOGRAPHIC DATA AND ARTICLES HAVING ENHANCED DATA STORAGE LIFETIME DERIVED THEREFROM

BACKGROUND

The present disclosure relates to methods for storing holographic data. Further, the present disclosure relates to holographic data storage media and articles having an enhanced data storage lifetime, which are derived from these methods.

Holographic storage is the storage of data in the form of holograms, which are images of three dimensional interference patterns created by the intersection of two beams of light, in a photosensitive medium. The superposition of a signal beam, which contains digitally encoded data, and a reference beam forms an interference pattern within the volume of the medium resulting in a chemical reaction that changes or modulates the refractive index of the medium. This modulation serves to record as the hologram both the intensity and phase information from the signal. The hologram can later be retrieved by exposing the storage medium to the reference beam alone, which interacts with the stored holographic data to generate a reconstructed signal beam proportional to the initial signal beam used to store the holographic image. Thus, in holographic data storage, data is stored throughout the volume of the medium via three dimensional interference patterns.

Each hologram may contain anywhere from one to $1 \times 10^6$ or more bits of data. One distinct advantage of holographic storage over surface-based storage formats, including CDs or DVDs, is that a large number of holograms may be stored in an overlapping manner in the same volume of the photosensitive medium using a multiplexing technique, such as by varying the signal and/or reference beam angle, wavelength, or medium position. However, a major impediment towards the realization of holographic storage as a viable technique has been the development of a reliable and economically feasible storage medium.

Early holographic storage media employed inorganic photo-refractive crystals, such as doped or un-doped lithium niobate ($LiNbO_3$), in which incident light creates refractive index changes. These refractive index changes are due to the photo-induced creation and subsequent trapping of electrons leading to an induced internal electric field that ultimately modifies the refractive index through a linear electro-optic effect. However, $LiNbO_3$ is expensive, exhibits relatively poor efficiency, fades over time, and requires thick crystals to observe any significant index changes.

Therefore, there is a need for improved holographic data storage methods and materials through which enhanced holographic data storage capacities can be achieved Further, there is also a need for methods to enhance the lifetime of the stored holographic data, such that for example, the data is not erased thermally, or when ambient light is incident on the data storage medium, or during read-out.

SUMMARY

Disclosed herein are methods for storing holographic data in a storage medium having an enhanced data storage lifetime, and articles made using these methods.

In one aspect, the present invention provides a method for storing holographic data, said method comprising:

step (A) providing an optically transparent substrate comprising a photochemically active dye having structure (I)

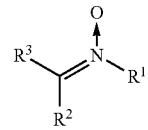

wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

wherein X is independently at each occurrence an oxygen atom, a nitrogen atom, a sulfur atom, or a selenium atom; $P^1$ is an organic protecting group, and "a" is 1 or 2;

step (B) irradiating the optically transparent substrate with a holographic interference pattern, wherein the pattern has a first wavelength and an intensity both sufficient to convert, within a volume element of the substrate, at least some of the photochemically active dye into a photo-product, and producing within the irradiated volume element concentration variations of the photo-product corresponding to the holographic interference pattern, thereby producing an optically readable datum corresponding to the volume element; and step (C) activating the optically transparent substrate to form an intramolecular hydrogen bond to a nitrone oxygen in residual photochemically active nitrone dye, to stabilize the optically readable datum.

In another aspect, the present invention provides a method for storing holographic data, said method comprising:

step (A) providing an optically transparent substrate comprising a photochemically active nitrone having structure (VI)

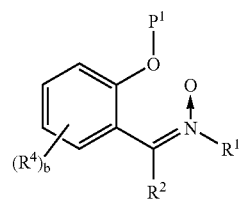

wherein $R^1$ is a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; $P^1$ is an organic protecting group; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; and "b" is an integer from 0 to 4 inclusive;

step (B) irradiating the optically transparent substrate with a holographic interference pattern, wherein the pattern has a first wavelength and an intensity both sufficient to convert, within a volume element of the substrate, at least some of the photochemically active nitrone into a photo-product of the photochemically active nitrone, and producing within the irradiated volume element concentration variations of the photo-product corresponding to the holographic interference pattern, thereby producing a first optically readable datum corresponding to the volume element; and step (C) activating the optically transparent substrate to form an intramolecular hydrogen bond to a nitrone oxygen in residual photochemically active nitrone dye, to stabilize the optically readable datum.

In still yet another aspect, the present invention provides an optical writing/reading method, said method comprising:

step (A) irradiating with a holographic interference pattern an optically transparent substrate that comprises a photochemically active dye having structure (1)

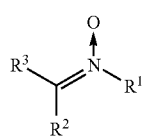

I wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

wherein X is independently at each occurrence an oxygen atom, a nitrogen atom, a sulfur atom, or a selenium atom; $P^1$ is an organic protecting group, and "a" is 1 or 2;

wherein the pattern has a first wavelength and an intensity both sufficient to convert, within a volume element of the substrate, at least some of the photochemically active dye into a photo-product, and producing within the irradiated volume element concentration variations of the photo-product corresponding to the holographic interference pattern, thereby producing a first optically readable datum corresponding to the volume element; wherein the holographic interference pattern is produced by simultaneously irradiating the optically transparent substrate with two interfering beams at the first wavelength;

step (B) activating the optically transparent substrate to form an intramolecular hydrogen bond to a nitrone oxygen in residual photochemically active nitrone dye, to stabilize the optically readable datum; and step (C) irradiating the optically transparent substrate with a read beam and reading the optically readable datum by detecting diffracted light.

In yet another embodiment another embodiment, the present invention provides data storage medium comprising:
an optically transparent plastic material; and
a photochemically active dye having structure (I)

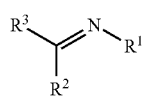

I wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

wherein X is independently at each occurrence an oxygen atom, a nitrogen atom, a sulfur atom, or a selenium atom; $P^1$ is an organic protecting group, and "a" is 1 or 2.

In yet another embodiment, the present invention provides a data storage medium having at least one optically readable datum stored therein, the data storage medium comprising:
an optically transparent plastic material;
a photochemically active dye having structure (I)

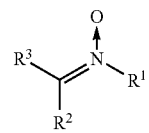

I wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

wherein X is independently at each occurrence an oxygen atom, a nitrogen atom, a sulfur atom, or a selenium atom; $P^1$ is an organic protecting group, and "a" is 1 or 2;
a photo-product derived from the photochemically active dye; and
a photo-stable product derived from the photochemically active dye, the photo-product, or combinations thereof;
wherein the optically readable datum is stored as a hologram patterned within at least one volume element of the optically transparent substrate.

These and other features, aspects, and advantages of the present invention may be more understood more readily by reference to the following detailed description.

DETAILED DESCRIPTION

Some aspects of the present invention and general scientific principles used herein can be more clearly understood by referring to U.S. Patent Application 2005/0136333 (Ser. No. 10,742,461), which was published on Jun. 23, 2005; co-pending application having Ser. No. 10/954,779, filed on Sep. 30, 2004; and co-pending application having Ser. No. 11/260,806, filed on Oct. 27, 2005; all of which are incorporated herein by reference in their entirety. It should be noted that with respect to the interpretation and meaning of terms in the present application, in the event of a conflict between this application and any document incorporated herein by reference, the conflict is to be resolved in favor of the definition or interpretation provided by the present application.

As used herein, the term "aromatic radical" refers to an array of atoms having a valence of at least one comprising at least one aromatic group. The array of atoms having a valence of at least one comprising at least one aromatic group may include heteroatoms such as nitrogen, sulfur, selenium, silicon and oxygen, or may be composed exclusively of carbon and hydrogen. As used herein, the term "aromatic radical" includes but is not limited to phenyl, pyridyl, furanyl, thienyl, naphthyl, phenylene, and biphenyl radicals. As noted, the aromatic radical contains at least one aromatic group. The aromatic group is invariably a cyclic structure having 4n+2 "delocalized" electrons where "n" is an integer equal to 1 or greater, as illustrated by phenyl groups (n=1), thienyl groups (n=1), furanyl groups (n=1), naphthyl groups (n=2), azulenyl groups (n=2), anthraceneyl groups (n=3) and the like. The aromatic radical may also include nonaromatic components. For example, a benzyl group is an aromatic radical which comprises a phenyl ring (the aromatic group) and a methylene group (the nonaromatic component). Similarly a tetrahydronaphthyl radical is an aromatic radical comprising an aromatic group ($C_6H_3$) fused to a nonaromatic component —$(CH_2)_4$—. For convenience, the term "aromatic radical" is defined herein to encompass a wide range of functional groups such as alkyl groups, alkenyl groups, alkynyl groups, haloalkyl groups, haloaromatic groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylphenyl radical is a $C_7$ aromatic radical comprising a methyl group, the methyl group being a functional group which is an alkyl group. Similarly, the 2-nitrophenyl group is a $C_6$ aromatic radical comprising a nitro group, the nitro group being a functional group. Aromatic radicals include halogenated aromatic radicals such as 4-trifluoromethylphenyl, hexafluoroisopropylidenebis(4-phen-1-yloxy) (i.e., —$OPhC(CF_3)_2$PhO—), 4-chloromethylphen-1-yl, 3-trifluorovinyl-2-thienyl, 3-trichloromethylphen-1-yl (i.e., 3-$CCl_3$Ph—), 4-(3-bromoprop-1-yl)phen-1-yl (i.e., 4-$BrCH_2CH_2CH_2$Ph—), and the like. Further examples of aromatic radicals include 4-allyloxyphen-1-oxy, 4-aminophen-1-yl (i.e., 4-$H_2$NPh—), 3-aminocarbonylphen-1-yl (i.e., $NH_2$COPh—), 4-benzoylphen-1-yl, dicyanomethylidenebis(4-phen-1-yloxy) (i.e., —$OPhC(CN)_2$PhO—), 3-methylphen-1-yl, methylenebis(4-phen-1-yloxy) (i.e., —$OPhCH_2$PhO—), 2-ethylphen-1-yl, phenylethenyl, 3-formyl-2-thienyl, 2-hexyl-5-furanyl, hexamethylene-1,6-bis(4-phen-1-yloxy) (i.e., —$OPh(CH_2)_6$PhO—), 4-hydroxymethylphen-1-yl (i.e., 4-$HOCH_2$Ph—), 4-mercaptomethylphen-1-yl (i.e., 4-$HSCH_2$Ph—), 4-methylthiophen-1-yl (i.e., 4-$CH_3$SPh—), 3-methoxyphen-1-yl, 2-methoxycarbonylphen-1-yloxy (e.g., methyl salicyl), 2-nitromethylphen-1-yl (i.e., 2-$NO_2CH_2$Ph), 3-trimethylsilylphen-1-yl, 4-t-butyldimethylsilylphenl-1-yl, 4-vinylphen-1-yl, vinylidenebis(phenyl), and the like. The term "a $C_3$–$C_{10}$ aromatic radical" includes aromatic radicals containing at least three but no more than 10 carbon atoms. The aromatic radical 1-imidazolyl ($C_3H_2N_2$—) represents a $C_3$ aromatic radical. The benzyl radical ($C_7H_7$—) represents a $C_7$ aromatic radical.

As used herein the term "cycloaliphatic radical" refers to a radical having a valence of at least one, and comprising an array of atoms which is cyclic but which is not aromatic. As defined herein a "cycloaliphatic radical" does not contain an aromatic group. A "cycloaliphatic radical" may comprise one or more noncyclic components. For example, a cyclohexylmethyl group ($C_6H_{11}CH_2$—) is a cycloaliphatic radical which comprises a cyclohexyl ring (the array of atoms which is cyclic but which is not aromatic) and a methylene group (the noncyclic component). The cycloaliphatic radical may include heteroatoms such as nitrogen, sulfur, selenium, silicon and oxygen, or may be composed exclusively of carbon and hydrogen. For convenience, the term "cycloaliphatic radical" is defined herein to encompass a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylcyclopent-1-yl radical is a $C_6$ cycloaliphatic radical comprising a methyl group, the methyl group being a functional group which is an alkyl group. Similarly, the 2-nitrocyclobut-1-yl radical is a $C_4$ cycloaliphatic radical comprising a nitro group, the nitro group being a functional group. A cycloaliphatic radical may comprise one or more halogen atoms which may be the same or different. Halogen atoms include, for example; fluorine, chlorine, bromine, and iodine. Cycloaliphatic radicals comprising one or more halogen atoms include 2-trifluoromethylcyclohex-1-yl, 4-bromodifluoromethylcyclooct-1-yl, 2-chlorodifluoromethylcyclohex-1-yl, hexafluoroisopropylidene-2,2-bis (cyclohex-4-yl) (i.e., —$C_6H_{10}C(CF_3)_2C_6H_{10}$—), 2-chloromethylcyclohex-1-yl, 3-difluoromethylenecyclohex-1-yl, 4-trichloromethylcyclohex-1-yloxy, 4-bromodichloromethylcyclohex-1-ylthio, 2-bromoethylcyclopent-1-yl, 2-bromopropylcyclohex-1-yloxy (e.g., $CH_3CHBrCH_2C_6H_{10}O$—), and the like. Further examples of cycloaliphatic radicals include 4-allyloxycyclohex-1-yl, 4-aminocyclohex-1-yl (i.e., $H_2NC_6H_{10}$—), 4-aminocarbonylcyclopent-1-yl (i.e., $NH_2COC_5H_8$—), 4-acetyloxycyclohex-1-yl, 2,2-dicyanoisopropylidenebis(cyclohex-4-yloxy) (i.e., —$OC_6H_{10}C(CN)_2C_6H_{10}O$—), 3-methylcyclohex-1-yl, methylenebis(cyclohex-4-yloxy) (i.e., —$OC_6H_{10}CH_2C_6H_{10}O$—), 1-ethylcyclobut-1-yl, cyclopropylethenyl, 3-formyl-2-terahydrofuranyl, 2-hexyl-5-tetrahydrofuranyl, hexamethylene-1,6-bis(cyclohex-4-yloxy) (i.e., –O $C_6H_{10}(CH_2)_6C_6H_{10}O$—), 4-hydroxymethylcyclohex-1-yl (i.e., 4-$HOCH_2C_6H_{10}$—), 4-mercaptomethylcyclohex-1-yl (i.e., 4-$HSCH_2C_6H_{10}$—), 4-methylthiocyclohex-1-yl (i.e., 4-$CH_3SC_6H_{10}$—), 4-methoxycyclohex-1-yl, 2-methoxycarbonylcyclohex-1-yloxy (2-$CH_3OCOC_6H_{10}O$—), 4-nitromethylcyclohex-1-yl (i.e., $NO_2CH_2C_6H_{10}$—), 3-trimethylsilylcyclohex-1-yl, 2-t-butyldimethylsilylcyclopent-1-yl, 4-trimethoxysilylethylcyclohex-1-yl (e.g., $(CH_3O)_3SiCH_2CH_2C_6H_{10}$—), 4-vinylcyclohexen-1-yl, vinylidenebis (cyclohexyl), and the like. The term "a $C_3$–$C_{10}$ cycloaliphatic radical" includes cycloaliphatic radicals containing at least three but no more than 10 carbon atoms. The cycloaliphatic radical 2-tetrahydrofuranyl ($C_4H_7O$—) represents a $C_4$ cycloaliphatic radical. The cyclohexylmethyl radical ($C_6H_{11}CH_2$—) represents a $C_7$ cycloaliphatic radical.

As used herein the term "aliphatic radical" refers to an organic radical having a valence of at least one consisting of a linear or branched array of atoms which is not cyclic. Aliphatic radicals are defined to comprise at least one carbon atom. The array of atoms comprising the aliphatic radical may include heteroatoms such as nitrogen, sulfur, silicon, selenium and oxygen or may be composed exclusively of carbon and hydrogen. For convenience, the term "aliphatic radical" is defined herein to encompass, as part of the "linear or branched array of atoms which is not cyclic" a wide range of functional groups such as alkyl groups, alkenyl groups, alkynyl groups, haloalkyl groups, conjugated dienyl groups, alcohol groups, ether groups, aldehyde groups, ketone groups, carboxylic acid groups, acyl groups (for example carboxylic acid derivatives such as esters and amides), amine groups, nitro groups, and the like. For example, the 4-methylpent-1-yl radical is a $C_6$ aliphatic radical comprising a methyl group, the methyl group being a functional group which is an alkyl group. Similarly, the 4-nitrobut-1-yl group is a $C_4$ aliphatic radical comprising a nitro group, the nitro group being a functional group. An aliphatic radical may be a haloalkyl group which comprises one or more halogen atoms which may be the same or different. Halogen atoms include, for example; fluorine, chlorine, bromine, and iodine. Aliphatic radicals comprising one or more halogen atoms include the alkyl halides trifluoromethyl, bromodifluoromethyl, chlorodifluoromethyl, hexafluoroisopropylidene, chloromethyl, difluorovinylidene, trichloromethyl, bromodichloromethyl, bromoethyl, 2-bromotrimethylene (e.g., $-CH_2CHBrCH_2-$), and the like. Further examples of aliphatic radicals include allyl, aminocarbonyl (i.e., $-CONH_2$), carbonyl, 2,2-dicyanoisopropylidene (i.e., $-CH_2C(CN)_2CH_2-$), methyl (i.e., $-CH_3$), methylene (i.e., $-CH_2-$), ethyl, ethylene, formyl (i.e., $-CHO$), hexyl, hexamethylene, hydroxymethyl (i.e., $-CH_2OH$), mercaptomethyl (i.e., $-CH_2SH$), methylthio (i.e., $-SCH_3$), methylthiomethyl (i.e., $-CH_2SCH_3$), methoxy, methoxycarbonyl (i.e., $CH_3OCO-$), nitromethyl (i.e., $-CH_2NO_2$), thiocarbonyl, trimethylsilyl (i.e., $(CH_3)_3Si-$), t-butyldimethylsilyl, 3-trimethyoxysilylpropyl (i.e., $(CH_3O)_3SiCH_2CH_2CH_2-$), vinyl, vinylidene, and the like. By way of further example, a $C_1-C_{10}$ aliphatic radical contains at least one but no more than 10 carbon atoms. A methyl group (i.e., $CH_3-$) is an example of a $C_1$ aliphatic radical. A decyl group (i.e., $CH_3(CH_2)_9-$) is an example of a $C_{10}$ aliphatic radical.

As used herein, the terms "photochemically reactive" and "photochemically active" have the same meaning and are interchangeable terms.

As defined herein, the term "photo-stable product" refers to a reaction product which shows greater photostability than a corresponding photochemically active chemical species from which it was derived. For example, protonation of a photochemically active nitrone dye affords as a reaction product, the corresponding protonated nitrone. The protonated nitrone is a "photo-stable product" because it shows greater photostability on average than does the unprotonated photochemically active nitrone dye from which it was derived.

As defined herein, the term "optically transparent" as applied to an optically transparent substrate or an optically transparent plastic material means that the substrate or plastic material has an absorbance of less than 1. That is, at least 10 percent of incident light is transmitted through the material at at least one wavelength in a range between about 300 and about 800 nanometers. For example, when configured as a film having a thickness suitable for use in holographic data storage said film exhibits an absorbance of less than 1 at at least one wavelength in a range between about 300 and about 800 nanometers.

As defined herein, the term "volume element" means a three dimensional portion of a total volume.

As defined herein, the term "optically readable datum" can be understood as a datum that is stored as a hologram patterned within one or more volume elements of an optically transparent substrate.

As used herein, the term "enhanced lifetime" refers to an enhanced data robustness. For example, an optically readable datum stabilized according to the method of the present invention can be subjected to an increased number of read-out cycles of the optically readable datum without performance degradation relative to the corresponding unstabilized optically readable datum.

As noted, holographic data storage relies upon the introduction of localized variations in the refractive index of the optically transparent substrate comprising the photochemically active dye as a means of storing holograms. The refractive index within an individual volume element of the optically transparent substrate may be constant throughout the volume element, as in the case of a volume element that has not been exposed to electromagnetic radiation, or in the case of a volume element in which the photochemically active dye has been reacted to the same degree throughout the volume element. It is believed that most volume elements that have been exposed to electromagnetic radiation during the holographic data writing process will contain a complex holographic pattern, and as such, the refractive index within the volume element will vary across the volume element. In instances in which the refractive index within the volume element varies across the volume element, it is convenient to regard the volume element as having an "average refractive index" which may be compared to the refractive index of the corresponding volume element prior to irradiation. Thus, in one embodiment an optically readable datum comprises at least one volume element having a refractive index that is different from a (the) corresponding volume element of the optically transparent substrate prior to irradiation. Data storage is achieved by locally changing the refractive index of the data storage medium in a graded fashion (continuous sinusoidal variations), rather than discrete steps, and then using the induced changes as diffractive optical elements.

As defined herein, the term M/# denotes the capacity of a data storage medium, and can be measured as a function of the total number of multiplexed holograms that can be recorded at a volume element of the data storage medium at a given diffraction efficiency. M/# depends upon various parameters, such as the change in refractive index ($\Delta n$), the thickness of the medium, and the dye concentration. These terms are described further in this disclosure. The M/# is defined as shown in equation (1):

$$M/\# = \sum_{i=1}^{N} \sqrt{\eta_i} \qquad \text{Equation (1)}$$

where $\eta_i$ is the diffraction efficiency of the $i^{th}$ hologram, and N is the number of recorded holograms. The experimental setup for M/# measurement for a test sample at a chosen wavelength, for example, at 532 nanometers or 405 nanometers involves positioning the testing sample on a rotary stage that is controlled by a computer. The rotary stage has a high angular resolution, for example, about 0.0001 degree. A M/# measurement involves two steps: recording and readout. At recording, multiple planewave holograms are recorded at the same location on the same sample. A plane wave hologram is a recorded interference pattern produced by a signal beam and a reference beam. The signal and reference beams are coherent to each other. They are both planewaves that have the same power and beam size, incident at the same location on the sample, and polarized in the same direction. Multiple planewave holograms are recorded by rotating the sample. Angular spacing between two adjacent holograms is about 0.2 degree. This spacing is chosen so that their impact to the previously recorded holograms, when multiplexing additional holograms, is minimal and at the same time, the usage of the total capacity of the media is efficient. Recording time for each hologram is generally the same in M/# measurements. At readout, the signal beam is blocked. The diffracted signal is measured using the reference beam and an amplified photo-detector. Diffracted power is measured by rotating the sample across the recording angle range with a step size of about 0.004 degree. The power of the reference beam used for readout is typically about 2–3 orders of magnitude smaller than that used at recording. This is to minimize hologram erasure during readout while maintaining a measurable diffracted signal. From the diffracted signal, the multiplexed holograms can be identified from the diffraction peaks at the hologram recording angles. The diffraction efficiency of the $i^{th}$ hologram, $\eta_i$, is then calculated by using equation (2):

$$\eta_i = \frac{P_{i,\text{diffracted}}}{P_{\text{reference}}} \qquad \text{Equation (2)}$$

where $P_{i,\text{diffracted}}$ is the diffracted power of the $i^{th}$ hologram. M/# is then calculated using the diffraction efficiencies of the holograms and equation (1). Thus, a holographic plane wave characterization system may be used to test the characteristics of the data storage material, especially multiplexed holograms. Further, the characteristics of the data storage material can also be determined by measuring the diffraction efficiency.

The capacity to store data as holograms (M/#) is also directly proportional to the ratio of the change in refractive index per unit dye density ($\Delta n/N0$) at the wavelength used for reading the data to the absorption cross section ($\sigma$) at a given wavelength used for writing the data as a hologram. The refractive index change per unit dye density is given by the ratio of the difference in refractive index of the volume element before irradiation minus the refractive index of the same volume element after irradiation to the density of the dye molecules. The refractive index change per unit dye density has a unit of (centimeter)$^3$. Thus in an embodiment, the optically readable datum comprises at least one volume element wherein the ratio of the change in the refractive index per unit dye density of the at least one volume element to an absorption cross section of the at least one photochemically active dye is at least about $10^{-5}$ expressed in units of centimeter.

Sensitivity (S) is a measure of the diffraction efficiency of a hologram recorded using a certain amount of light fluence (F). The light fluence (F) is given by the product of light intensity (I) and recording time (t). Mathematically, sensitivity is given by equation (3), $$S = \frac{\sqrt{\eta}}{I \cdot t \cdot L}(\text{cm/J})$$

wherein I is the intensity of the recording beam, "t" is the recording time, L is the thickness of the recording (or data storage) medium (example, disc), and $\eta$ is the diffraction efficiency. Diffraction efficiency is given by equation (4), $$\eta = \sin^2\left(\frac{\pi \cdot \Delta n \cdot L}{\lambda \cdot \cos(\theta)}\right) \qquad \text{Equation (4)}$$

wherein $\lambda$ is the wavelength of light in the recording medium, $\theta$ is the recording angle in the media, and $\Delta n$ is the refractive index contrast of the grating, which is produced by the recording process, wherein the dye molecule undergoes a photochemical conversion.

The absorption cross section is a measurement of an atom or molecule's ability to absorb light at a specified wavelength, and is measured in square cm/molecule. It is generally denoted by $\sigma(\lambda)$ and is governed by the Beer-Lambert Law for optically thin samples as shown in Equation (5), $$\sigma(\lambda) = \ln(10) \cdot \frac{\text{Absorbance}(\lambda)}{N_0 \cdot L}(\text{cm}^2) \qquad \text{Equation (5)}$$

wherein $N_0$ is the concentration in molecules per cubic centimeter, and L is the sample thickness in centimeters.

Quantum efficiency (QE) is a measure of the probability of a photochemical transition for each absorbed photon of a given wavelength. Thus, it gives a measure of the efficiency with which incident light is used to achieve a given photochemical conversion, also called as a bleaching process. QE is given by equation (6), $$QE = \frac{hc/\lambda}{\sigma \cdot F_0} \qquad \text{Equation (6)}$$

wherein "h" is the Planck's constant, "c" is the velocity of light, $\sigma(\lambda)$ is the absorption cross section at the wavelength $\lambda$, and $F_0$ is the bleaching fluence. The parameter $F_0$ is given by the product of light intensity (I) and a time constant ($\tau$) that characterizes the bleaching process.

The photochemically active dye is one which renders the optically transparent substrate capable of having holograms "written" into it at a first wavelength. And further, the photochemically active dye should be such that a hologram having been "written" into the optically transparent substrate at a first wavelength is not erased when the hologram is "read". It is desirable to use dyes that enable "writing" of the holographic interference pattern into the optically transparent substrate at a wavelength in a range from about 300 nm to about 800 nm.

In one embodiment, the photochemically active dye has an optical absorption resonance characterized by a center wavelength associated with the maximum absorption and a spectral width (full width at half of the maximum, FWHM) of less than 500 nanometers. Typically, the photochemically active dyes undergo a light induced chemical reaction when exposed to light with a wavelength within the absorption range to form at least one photo-product. This reaction can be a photo-decomposition reaction, such as oxidation, reduction, or bond breaking to form smaller constituents, or a molecular rearrangement, such as a sigmatropic rearrangement, or addition reactions including pericyclic cycloadditions. Thus in an embodiment, data storage in the form of holograms is achieved wherein the photo-product is patterned (for example, in a graded fashion) within the modified optically transparent substrate to provide the at least one optically readable datum.

In an embodiment, the photochemically active dye is a photochemically active nitrone dye having structure (I)

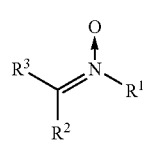

I wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical;

and at least one of the groups $R^1$ and $R^3$ comprises in proximity to the nitrone oxygen, a group $$-X-(P^1)_a$$

wherein X is independently at each occurrence an oxygen atom, a nitrogen atom, a sulfur atom, or a selenium atom; $P^1$ is an organic protecting group, and "a" is 1 or 2.

The group $-X-(P^1)_a$ represents a protected hydrogen bond donor group, for example a hydroxy group (—OH), a mercapto group (—SH), a selenol group (—SeH), or an amino group (—NH). The group $P^1$ is a suitable organic protecting group, for example a trimethylsilyl group, a t-butyldimethylsilyl group, an acetyl group, a trifluoroacetyl group, a benzoyl group, p-nitrobenzoyl group, an ortho-nitrobenzyl group, a t-butoxycarbonyl group, a trimethylsilyloxycarbonyl group, and the like. The group $-X-(P^1)_a$ is exemplified by the trimethylsilyloxy group (X=O, $P^1$=Si(Me)$_3$, "a"=1), the trimethylsilyloxycarbonyloxy group (X=O, $P^1$=COOSi(Me)$_3$, "a"=1), the t-butoxycarbonyloxy group (X=O, $P^1$=COOC(Me)$_3$, "a"=1), the ortho-nitrobenzyloxy group (X=O, $P^1$=CH$_2$(o-nitrophenyl), "a"=1), the bistrimethylsilylamino group (X=N, $P^1$=Si(Me)$_3$, "a"=2), and the like. The group $-X-(P^1)_a$ is said to be "in proximity" to the nitrone oxygen. This means that the group $-X-(P^1)_a$ which results upon deprotection (i.e. replacement of the organic protecting group $P^1$ by hydrogen) of the group $-X-(P^1)_a$ is capable of forming an intramolecular hydrogen bond with the nitrone oxygen. The formation of an intramolecular hydrogen bond results in a cyclic structure comprising the intramolecular hydrogen bond. Although a variety of ring sizes are possible, intramolecular hydrogen bonding resulting in five- and six-membered ring formation is especially favored.

In one embodiment, a combination comprising two or more photochemically active nitrone dyes having structure (I) is used.

Photochemically active nitrones are particularly useful compounds for producing holographic data storage articles. In an embodiment, the photochemically active nitrone has desirable optical properties, such as a relatively low absorption cross-section at the reading and writing wavelengths employed in data storage and retrieval, while having a relatively high refractive index change and/or relatively high quantum efficiency for the photo-induced reaction. High quantum efficiency also leads to a higher sensitivity since sensitivity is directly proportional to the product of quantum efficiency and refractive index change (defined as $\Delta n$). Writing of data as a hologram into the optically transparent substrate comprising the photochemical active dye is due to the dye undergoing a partial photochemical conversion at the write wavelength, thereby producing a modified optically transparent substrate comprising at least one optically readable datum. The "write wavelength" corresponds to the wavelength of the holographic interference pattern which is used to irradiate the optically transparent substrate. The sensitivity of a dye-doped data storage material (here, an optically transparent substrate comprising a photochemically reactive dye) is dependent upon the concentration of the dye ($N_0$), the dye's absorption cross-section at the recording wavelength, the quantum efficiency QE of the photochemical transition, and the index change of the dye molecule for a unit dye density ($\Delta n_0/N_0$). However, as the product of dye concentration and the absorption cross-section increases, the dye-doped storage material tends to become opaque, which inhibits both recording and readout. Therefore, in an embodiment, photochemically active nitrones of interest for achieving high M/#s are those materials that undergo an efficient photochemical transformation accompanied with a high refractive index change and a high quantum efficiency at the wavelength that is used for writing data, one that is removed from the main UV-visible absorption peak of the dye. One example of a photochemically active nitrone dye is SIPN (α-styrenyl isopropyl nitrone), which rearranges to an oxaziridine with high quantum efficiency (QE greater than 0.1), upon irradiation with light having a wavelength of 405 nm. The nitrone dyes having structure (I) are believed to possess data writing capabilities and characteristics similar to conventional nitrones such as SIPN, but possess the added advantage that they are self-stabilizing following activation (deprotection of the group $-X-(P^1)_a$ to afford the group $-X-(P^1)_a$ owing to the formation of at least one intramolecular hydrogen bond to a nitrone oxygen.

In one embodiment of the present invention, the photochemically active dye is a nitrone having structure (II)

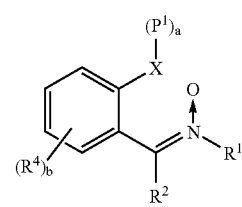

II wherein $R^1$ is a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; and "b" is an integer from 0 to 4 inclusive. Examples of suitable nitrones having structure (II) are given in Table 1.

TABLE 1

Examples Of Photochemically Active Nitrones (II)

| Entry | R1 | R2 | R4 | X | P1 | a | b |
|---|---|---|---|---|---|---|---|
| (II)-a |  | H | — | O | Si(Me)$_3$ | 1 | 0 |

TABLE 1-continued

Examples Of Photochemically Active Nitrones (II)

| Entry | R1 | R2 | R4 | X | P1 | a | b |
|---|---|---|---|---|---|---|---|
| (II)-b | phenyl | H | — | S | Si(Me)$_3$ | 1 | 0 |
| (II)-c | phenyl | H | — | Se | Si(Me)$_3$ | 1 | 0 |
| (II)-d | —C(CH$_3$)$_3$ | CH$_3$ | 4-CN | O | -CH$_2$-(2-NO$_2$-phenyl) | 1 | 1 |
| (II)-e | 2-naphthyl | H | — | N | -CH$_2$-(2-NO$_2$-phenyl) | 2 | 0 |
| (II)-f | cyclohexyl | H | 4-Me | O | -OC(O)C(CH$_3$)$_3$ | 1 | 1 |

In another embodiment of the present invention, the photochemically active dye is a nitrone having structure (III)

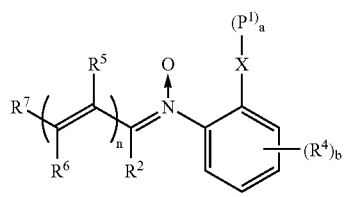

III wherein $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; "b" is an integer from 0 to 4 inclusive; $R^5$, $R^6$, and $R^7$ are independently at each occurrence, hydrogen, halogen, a $C_1$–$C_{30}$ aliphatic radical, a $C_3$–$C_{30}$ cycloaliphatic radical, or a $C_2$–$C_{30}$ aromatic radical; and "n" is an integer from 0 to 4 inclusive. Examples of suitable nitrones having structure (III) are given in Table 2.

TABLE 2

Examples Of Photochemically Active Nitrones (III)

| Entry | R2 | R4 | R5 | R6 | R7 | X | P1 | a | b | n |
|---|---|---|---|---|---|---|---|---|---|---|
| (III)-a | H | — | — | — | phenyl | O | Si(Me)$_3$ | 1 | 0 | 0 |
| (III)-b | H | — | — | — | thiophenyl | O | Si(Me)$_3$ | 1 | 0 | 0 |
| (III)-c | H | — | H | H | phenyl | Se | Si(Me)$_3$ | 1 | 0 | 1 |

TABLE 2-continued

Examples Of Photochemically Active Nitrones (III)

| Entry | R2 | R4 | R5 | R6 | R7 | X | P1 | a | b | n |
|---|---|---|---|---|---|---|---|---|---|---|
| (III)-d | $CH_3$ | 4-CN | H | $CH_3$ | $CH_3$ | O | ![o-nitrobenzyl] $\overset{H_2}{C}$-C$_6$H$_4$-NO$_2$ | 1 | 1 | 1 |
| (III)-e | H | — | — | — | phenyl | N | $Si(Me)_3$ | 2 | 0 | 0 |
| (III)-f | H | 4-Me | H | H | phenyl | O | -C(=O)-O-C($CH_3$)$_3$ | 1 | 1 | 1 |

In another embodiment of the present invention, the photochemically active dye is a nitrone having structure (VI)

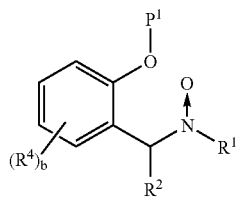

wherein $R^1$ is a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; $P^1$ is an organic protecting group; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; and "b" is an integer from 0 to 4 inclusive. Examples of suitable nitrones having structure (VI) are given in Table 3.

TABLE 3

Examples Of Photochemically Active Nitrones (VI)

| Entry | R1 | R2 | R4 | P1 | b |
|---|---|---|---|---|---|
| (VI)-a | phenyl | H | — | $Si(Me)_3$ | 0 |
| (VI)-b | thienyl | H | — | $Si(Me)_3$ | 0 |
| (VI)-c | phenyl | H | — | $Si(Me)_3$ | 0 |
| (VI)-d | $CH_3$ | $CH_3$ | 4-Cl | o-nitrobenzyl -$\overset{H_2}{C}$-C$_6$H$_4$-NO$_2$ | 1 |
| (VI)-e | phenyl | H | — | $Si(Me)_3$ | 0 |
| (VI)-f | phenyl | H | 4-Cl | -C(=O)-O-C($CH_3$)$_3$ | 1 |

In one embodiment, upon exposure to the holographic interference pattern having a first wavelength and intensity sufficient to record at least one optically readable datum, the photochemically active nitrone dispersed in an optically transparent substrate undergoes a unimolecular cyclization to an oxaziridine. The aromatic oxaziridine having structure (IV) results from irradiation of an aromatic nitrone having the structure (II),

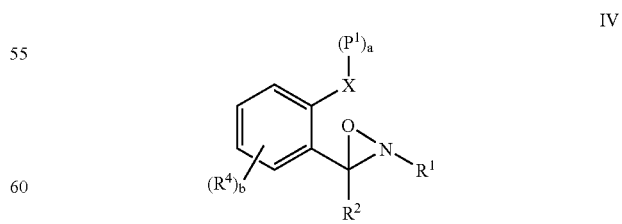

IV wherein $R^1$ is a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; and "b" is an integer from 0 to 4 inclusive. Aromatic oxaziridines are illustrated by the oxaziridines corresponding to nitrones (II)-a, (II)-b, (II)-c, (II)-d, (II)-e, and (II)-f given in Table 1.

In another embodiment, the aromatic oxaziridine having structure (V) results from irradiation of an aromatic nitrone having the structure (III),

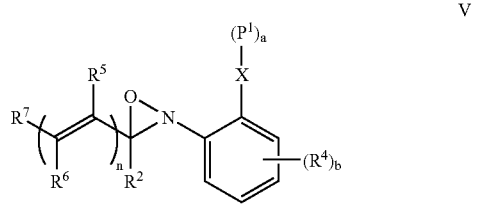

V wherein $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; "b" is an integer from 0 to 4 inclusive; $R^5$, $R^6$, and $R^7$ are independently at each occurrence, hydrogen, halogen, a $C_1$–$C_{30}$ aliphatic radical, a $C_3$–$C_{30}$ cycloaliphatic radical, or a $C_2$–$C_{30}$ aromatic radical; and "n" is an integer from 0 to 4 inclusive.

The photocyclization of the aromatic nitrone to the oxaziridine proceeds with a high quantum efficiency, and frequently a large refractive index change. Typically, the photocyclization is induced in only a portion of the total amount of the photochemically active nitrone present in a given volume element, thus providing a refractive index contrast between the unconverted dye and the oxaziridine photo-product, and providing the concentration variations of the photo-product corresponding to the holographic interference pattern, and constituting the optically readable datum.

In one embodiment, as noted above, step (B) in the method for storing holographic data, comprises irradiating the optically transparent substrate with a holographic interference pattern, wherein the pattern has a first wavelength and an intensity both sufficient to convert, within a volume element of the substrate, at least some of the photochemically active dye into a photo-product, and producing within the irradiated volume element concentration variations of the photo-product corresponding to the holographic interference pattern, thereby producing an optically readable datum corresponding to the volume element. The optically readable datum is stored in the optically transparent substrate as a hologram patterned within at least one volume element of the optically transparent substrate. In one embodiment, the photochemical conversion of a nitrone dye to photo-product(s) can occur within the context of a photodecomposition reaction, such as oxidation, reduction, or a bond breaking process to form smaller constituents; or a molecular rearrangement, such as a photocyclization, sigmatropic rearrangement; or addition reaction, including pericyclic cycloadditions. In an embodiment, the photoproduct is an aromatic oxaziridine derived from rearrangement (here photocyclization) of an aromatic nitrone.

Those skilled in the art will appreciate that the lingering photosensitivity of the unconverted (residual) photochemically reactive dye presents a general problem that can adversely affect the integrity of the stored data if no step is taken to stabilize the unconverted photochemically reactive dye. In the case where the unconverted photochemically reactive dye is a nitrone, protonation of the nitrone remaining following the recording of the holographic data provides an efficient means of preventing further conversion of the nitrone to photo-products under the influence of, for example, a read beam or ambient light. In one embodiment of the present invention, stabilization of the unconverted photochemically active dye is achieved activating the optically transparent substrate to affect deprotection of a hydroxy group in proximity to a nitrone oxygen in the residual photochemically active dye, to stabilize the optically readable datum. This leads to the formation of an intramolecularly hydrogen bonded photo-stable product of the photochemically active nitrone. Deprotection of the group —X—$(P^1)_a$ affords the corresponding deprotected hydrogen donor group, —X—$(P^1)_a$, which intramolecularly protonates the nitrone oxygen of the photochemically active nitrone, thereby rendering it substantially less photochemically active. In one embodiment, the protonated nitrone has much lower sensitivity to a read/write wavelength of 405 nm than the initial nitrone and hence displays enhanced data robustness.

In one embodiment, the step of activating includes photoactivating the residual photochemically active dye at a second wavelength and an intensity sufficient to form a protonated nitrone with an intramolecular hydrogen bond. In such instance the organic protecting group, $P^1$, is photolabile, and the protected hydrogen donor group, —X—$(P^1)_a$, while stable under conditions of step (B): irradiating the optically transparent substrate with a holographic interference pattern, wherein the pattern has a first wavelength and an intensity both sufficient to convert, within a volume element of the substrate, at least some of the photochemically active dye into a photo-product, and producing within the irradiated volume element concentration variations of the photo-product corresponding to the holographic interference pattern, thereby producing an optically readable datum corresponding to the volume element; is deprotected upon irradiation at a second wavelength. Photolabile protecting groups are well known to those skilled in the art and a wide variety of photolabile protecting groups $P^1$ are available. Pillai, V. N. R. *Synthesis*, (1980) pages 1–26 which is incorporated by reference herein in its entirety discloses a variety of such photolabile protecting groups $P^1$. In one embodiment, the photolabile protecting group is an ortho-nitrobenzyloxy group (e.g. Table 1, Entry (II)-d). In another embodiment, the step of activating includes thermally activating the residual photochemically active dye at thermal energies sufficient to form a protonated nitrone with an intramolecular hydrogen bond. Thermally labile protecting groups are known to those skilled in the art and include the tert-butoxycarbonyl group (e.g. Table 1, Entry (II)-f). In still another embodiment, the step of activating includes exposing the residual photochemically active dye to moisture at amounts sufficient to form a protonated nitrone with an intramolecular hydrogen bond. Examples of moisture sensitive protecting groups $P^1$ include trifluoroacetyl, trimethylsilyl, and the like. In yet another embodiment, the step of activating includes exposing the residual photochemically active dye to oxygen at amounts (quantities) sufficient to form a protonated nitrone with an intramolecular hydrogen bond. Oxygen sensitive protecting groups $P^1$ include the 1-methoxyvinyl group, and the like.

The UV-visible absorption spectra of the protonated nitrones resulting from the intramolecular protonation are similar to those of the parent nitrones. Hence in an embodiment, the refractive index contrast provided by the difference in refractive indices between an intramolecularly protonated nitrone and the corresponding "protected" (—X—(P¹)$_a$ is present) or "unprotected" (—X—(P¹)$_a$ is present) oxaziridine can also be used to store the data as a hologram patterned within at least one volume element of the optically transparent substrate.

In some embodiments, activation time of the medium to a source of activation, such as heat, light, oxygen or moisture is less than or about 60 seconds. In some other embodiments, the activation time is less than or about to 30 seconds. In still other embodiments, the activation time is less than or about 10 seconds. In one embodiment, the activation time is in a range from about 1 minute to about 10 minutes. In some embodiments, more that one source of activation, for example heat and moisture, may be simultaneous or in succession be applied to activate the photochemically active dye.

In a non-limiting example, a nitrone represented by structure (VII), wherein P¹ is an organic protecting group, is irradiated at a wavelength of 405 nanometers to undergo a unimolecular cyclization reaction to form an oxaziridine as illustrated in structure (VIII). The quantum efficiency of the forward reaction is estimated to be about 0.59. Some oxaziridines may undergo spontaneous molecular rearrangement to form formamides, which have spectra similar to oxaziridine and are not reversible. In one example, structure (IX) illustrates a formamide formed as a result of molecular rearrangement of the oxaziridine shown in structure (VIII).

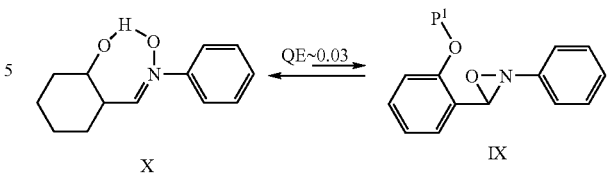

These examples illustrate the concept that if the nitrone is protonated after the information is stored, the photosensitivity of the remaining nitrone dye is lowered, and the lifetime of the stored holographic information is enhanced thereby. Thus, the protonated nitrone is expected to have a much lower sensitivity to the read/write wavelength than the initial nitrone, with the result that the lifetime of the stored data will be lengthened relative to holographic data stored but not subjected to an activation step resulting in the formation of an intramolecular hydrogen bond to the nitrone oxygen of residual photochemically active nitrone dye. In one aspect, the present invention can be utilized for storing holographic data reliably while minimizing adventitious data erasure and/or loss of data integrity.

In an embodiment, the optically transparent substrate is irradiated with a holographic interference pattern having a

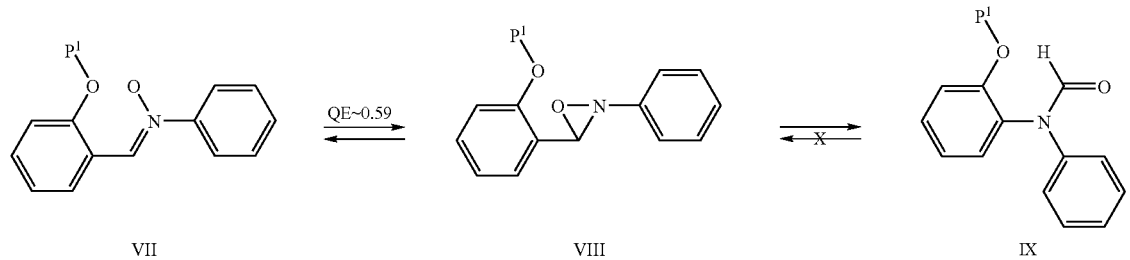

The nitrone shown in structure (VII) upon activation triggers the deprotection of a hydroxy group in proximity to the nitrone oxygen and results in a nitrone stabilized by an intramolecular hydrogen bond as shown in structure (X). Non-limiting examples of activation include photoactivation, thermal activation, activation by exposure to moisture and activation by exposure to oxygen. The protonated nitrone (X) has much lower sensitivity to light at 405 nm than the initial protected nitrone (VII) and hence exhibits improved photostability. Although intramolecularly protonated nitrone (X) may undergo molecular rearrangement to oxaziridine (XI), the quantum efficiency of the process is expected to be very low, here estimated to be on the order of 0.03.

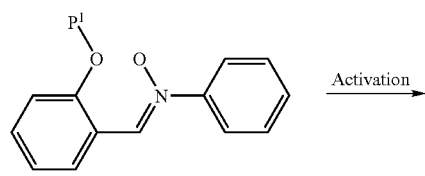

first wavelength to record data. The optically transparent substrate is then irradiated with radiation having a second wavelength to stabilize the written data, and the stabilized data can then be read using radiation having a third wavelength (e.g., a "read beam"), wherein the radiation at each step can independently have a wavelength from about 300 nm to about 1,500 nm. In an embodiment, the first, second, and third wavelengths can be independently between about 300 nm and about 800 nm. In one embodiment, the first wavelength (or the writing wavelength) for writing and recording the data onto the holographic data storage medium is from about 375 nm to about 450 nm. In another embodiment, the first wavelength can be from about 450 nm to about 550 nm. In one embodiment, the first wavelength is in a range from about 375 nm to about 450 nm and the second wavelength is in a range from about 450 to about 1500 nm. In another embodiment, the first wavelength is in a range from about 450 nm to about 550 nm and the second wavelength is in a range from about 550 to about 1500 nm. In still another embodiment, the writing wavelength is such that it is shifted by 0 nm to about 400 nm from the wavelength at which the recorded data is stabilized by the action of light of the second wavelength. Exemplary wavelengths at which writing and data stabilization are accomplished are about 405 nanometers (writing) and about 532 nanometers (stabilization).

The photochemically active nitrone dye is used in an amount from about 0.1 to about 10 weight percent in an embodiment, from about 1 weight percent to about 4 weight percent in another embodiment, and from about 4 weight percent to about 7 weight percent in still another embodiment, based on a total weight of the optically transparent substrate.

Optically transparent plastic materials may be advantageously employed in the preparation of the optically transparent substrate. Optically transparent plastic materials used in producing holographic data storage media (such as the optically transparent substrate) can comprise any plastic material having sufficient optical quality, e.g., low scatter, low birefringence, and negligible losses at the wavelengths of interest, to render the data in the holographic storage material readable. Organic polymeric materials, such as for example, oligomers, polymers, dendrimers, ionomers, copolymers such as for example, block copolymers, random copolymers, graft copolymers, star block copolymers; and the like, or a combination comprising at least one of the foregoing polymers can be used. Thermoplastic polymers or thermosetting polymers can be used. Examples of suitable thermoplastic polymers include polyacrylates, polymethacrylates, polyamides, polyesters, polyolefins, polycarbonates, polystyrenes, polyesters, polyamideimides, polyaromaticates, polyaromaticsulfones, polyethersulfones, polyphenylene sulfides, polysulfones, polyimides, polyetherimides, polyetherketones, polyether etherketones, polyether ketone ketones, polysiloxanes, polyurethanes, polyaromaticene ethers, polyethers, polyether amides, polyether esters, or the like, or a combination comprising at least one of the foregoing thermoplastic polymers. Some more possible examples of suitable thermoplastic polymers include, but are not limited to, amorphous and semi-crystalline thermoplastic polymers and polymer blends, such as: polyvinyl chloride, linear and cyclic polyolefins, chlorinated polyethylene, polypropylene, and the like; hydrogenated polysulfones, ABS resins, hydrogenated polystyrenes, syndiotactic and atactic polystyrenes, polycyclohexyl ethylene, styrene-acrylonitrile copolymer, styrene-maleic anhydride copolymer, and the like; polybutadiene, polymethylmethacrylate (P methyl methacrylate-polyimide copolymers; polyacrylonitrile, polyacetals, polyphenylene ethers, including, but not limited to, those derived from 2,6-dimethylphenol and copolymers with 2,3,6-trimethylphenol, and the like; ethylene-vinyl acetate copolymers, polyvinyl acetate, ethylene-tetrafluoroethylene copolymer, aromatic polyesters, polyvinyl fluoride, polyvinylidene fluoride, and polyvinylidene chloride.

In some embodiments, the thermoplastic polymer used in the methods disclosed herein as a substrate is made of a polycarbonate. The polycarbonate may be an aromatic polycarbonate, an aliphatic polycarbonate, or a polycarbonate comprising both aromatic and aliphatic structural units.

As used herein, the term "polycarbonate" includes compositions having structural units of the structure (XII),

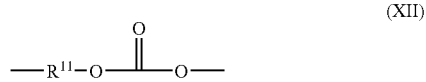

(XII)

where $R^{11}$ is an aliphatic, aromatic or a cycloaliphatic radical. In an embodiment, the polycarbonate comprises structural units of the structure (XIII):

(XIII)

wherein each of $A^1$ and $A^2$ is a monocyclic divalent aromatic radical and $Y^1$ is a bridging radical having zero, one, or two atoms which separate $A^1$ from $A^2$. In an exemplary embodiment, one atom separates $A^1$ from $A^2$. Illustrative, non-limiting examples of radicals of this type are —O—, —S—, —S(O)—, —S(O)$_2$—, —C(O)—, methylene, cyclohexyl-methylene, 2-ethylidene, isopropylidene, neopentylidene, cyclohexylidene, cyclopentadecylidene, cyclododecylidene, adamantylidene, and the like. Some examples of such bisphenol compounds are bis(hydroxy aromatic)ethers such as 4,4'-dihydroxy diphenylether, 4,4'-dihydroxy-3,3'-dimethylphenyl ether, and the like; bis(hydroxy aromatic)sulfides, such as 4,4'-dihydroxy diphenyl sulfide, 4,4'-dihydroxy-3,3'-dimethyl diphenyl sulfide, and the like; bis(hydroxy aromatic) sulfoxides, such as, 4,4'-dihydroxy diphenyl sulfoxides, 4,4'-dihydroxy-3,3'-dimethyl diphenyl sulfoxides, and the like; bis(hydroxy aromatic)sulfones, such as 4,4'-dihydroxy diphenyl sulfone, 4,4'-dihydroxy-3,3'-dimethyl diphenyl sulfone, and the like; and combinations comprising at least one of the foregoing bisphenol compounds. In another embodiment, zero atoms separate $A^1$ from $A^2$, with an illustrative example being biphenol. The bridging radical $Y^1$ can be a hydrocarbon group, such as, for example, methylene, cyclohexylidene or isopropylidene, or aromatic bridging groups.

Any of the dihydroxy aromatic compounds known in the art can be used to make the polycarbonates. Examples of dihydroxy aromatic compounds include, for example, compounds having general structure (XIV),

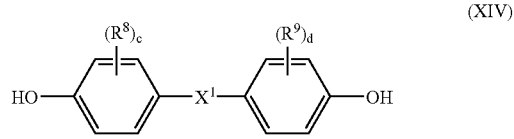

(XIV)

wherein $R^8$ and $R^9$ each independently represent a halogen atom, or an aliphatic radical, an aromatic radical, or a cycloaliphatic radical; "c" and "d" are each independently integers from 0 to 4; and $X^1$ represents an aromatic radical, a cycloaliphatic radical, an aliphatic radical, or one of the groups having structures (XV) or (XVI),

(XV)

(XVI)

wherein $R^{10}$ and $R^{11}$ each independently represent a hydrogen atom or an aliphatic radical, an aromatic radical, or a cycloaliphatic radical; and $R^{12}$ is a divalent aromatic radical, a divalent cycloaliphatic radical, or divalent aliphatic radical. In one embodiment, $R^{12}$ is the divalent aliphatic radical $CCl_2$. In another embodiment $R^{12}$ is a divalent radical which is a hydrocarbon group. Some illustrative, non-limiting examples of suitable dihydroxy aromatic compounds include dihydric phenols and the dihydroxy-substituted aromatic hydrocarbons such as those disclosed by name or structure (generic or specific) in U.S. Pat. No. 4,217,438. Polycarbonates comprising structural units derived from bisphenol A are preferred since they are relatively inexpensive and commercially readily available. A nonexclusive list of specific examples of the types of bisphenol compounds that may be represented by structure (XIV) includes the following: 1,1-bis(4-hydroxyphenyl)methane; 1,1-bis(4-hydroxyphenyl)ethane; 2,2-bis(4-hydroxyphenyl)propane (hereinafter "bisphenol A" or "BPA"); 2,2-bis(4-hydroxyphenyl)butane; 2,2-bis(4-hydroxyphenyl)octane; 1,1-bis(4-hydroxyphenyl)propane; 1,1-bis(4-hydroxyphenyl) n-butane; bis(4-hydroxyphenyl)phenylmethane; 2,2-bis(4-hydroxy-3-methylphenyl)propane (hereinafter "DMBPA"); 1,1-bis(4-hydroxy-t-butylphenyl)propane; 2,2-bis(4-hydroxy-3-bromophenyl)propane; 1,1-bis(4-hydroxyphenyl) cyclopentane; 9,9'-bis(4-hydroxyphenyl)fluorene; 9,9'-bis (4-hydroxy-3-methylphenyl)fluorene; 4,4'-biphenol; 1,1-bis (4-hydroxyphenyl)cyclohexane; 1,1-bis(4-hydroxy-3-methylphenyl)cyclohexane (hereinafter "DMBPC"); and the like, as well as combinations comprising at least one of the foregoing bisphenol compounds.

Polycarbonates can be produced by any of the methods known in the art. Branched polycarbonates are also useful, as well as blends of linear polycarbonates and branched polycarbonates. Preferred polycarbonates are based on bisphenol A. Preferably, the weight average molecular weight of the polycarbonate is about 5,000 to about 100,000 atomic mass units, more preferably about 10,000 to about 65,000 atomic mass units, and most preferably about 15,000 to about 35,000 atomic mass units. Other specific examples of a suitable thermoplastic polymer for use in forming the holographic data storage media include Lexan®, a polycarbonate; and Ultem®, an amorphous polyetherimide, both of which are commercially available from General Electric Company.

Examples of useful thermosetting polymers include those selected from the group consisting of an epoxy, a phenolic, a polysiloxane, a polyester, a polyurethane, a polyamide, a polyacrylate, a polymethacrylate, or a combination comprising at least one of the foregoing thermosetting polymers.

The photochemically active dye may be admixed with other additives to form a photo-active material. Examples of such additives include heat stabilizers; antioxidants; light stabilizers; plasticizers; antistatic agents; mold releasing agents; additional resins; binders; blowing agents; and the like, as well as combinations of the foregoing additives. The photo-active materials are used for manufacturing holographic data storage media.

Cycloaliphatic and aromatic polyesters can be used as binders for preparing the photo-active material. These are suitable for use with thermoplastic polymers, such as polycarbonates, to form the optically transparent substrate. These polyesters are optically transparent, and have improved weatherability, low water absorption and good melt compatibility with the polycarbonate matrix. Cycloaliphatic polyesters are generally prepared by reaction of a diol with a dibasic acid or an acid derivative, often in the presence of a suitable catalyst.

Generally, the photochemically active dyes and polymers used for forming the optically transparent substrate, and the holographic data storage medium should be capable of withstanding the processing conditions used to prepare the holographic data storage medium, for example during a step in which the photochemically active nitrone and any additional additives which may be present are compounded with a polymer powder and subsequently molded into data storage discs.

In an embodiment, the photochemically active dye is present in an amount from about 0.1 to about 10 weight percent, based on the total weight of the optically transparent substrate, and has a UV-visible absorbance in a range between about 0.1 and about 1 at a wavelength in a range between about 300 nm and about 800 nm. Such dyes are used in combination with other materials, such as, for example, binders to form photo-active materials, which in turn are used for manufacturing holographic data storage media. In an embodiment, a film of an optically transparent substrate comprising an optically transparent plastic material and at least one photochemically active dye is formed. Generally, the film is prepared by molding techniques using a molding composition that is obtained by mixing the dye with an optically transparent plastic material. Mixing can be conducted in machines such as a single or multiple screw extruder, a Buss kneader, a Henschel, a helicone, an Eirich mixer, a Ross mixer, a Banbury, a roll mill, molding machines such as injection molding machines, vacuum forming machines, blow molding machine, or then like, or a combination comprising at least one of the foregoing machines. Alternatively, the dye, and the optically transparent plastic material may be dissolved in a solution and films of the optically transparent substrate can be formed from the solution.

In one embodiment a data storage composition comprising a photochemically active nitrone, a thermoplastic polymer is injection molded to form an article that can be used for producing holographic data storage media. The injection-molded article can have any geometry. Examples of suitable geometries include circular discs, square shaped plates, polygonal shapes, or the like. The thickness of the articles can vary, from being at least 100 micrometers in an embodiment, and at least 250 micrometers in another embodiment. A thickness of at least 250 micrometers is useful in producing holographic data storage disks that are comparable to the thickness of current digital storage discs.

The molded data storage medium thus produced can be used for producing data storage articles, which can be used for storing data in the form of holograms. The data storage medium in the data storage article is irradiated with a holographic interference pattern having a first wavelength to record at least one optically readable datum and generate at least one photo-product of the photochemically active dye. The optically readable datum is stored as a hologram patterned within at least one volume element of the data storage medium. In one embodiment, the photo-product is an aromatic oxaziridine. Stabilization is achieved activating the optically transparent substrate to affect deprotection of a hydroxy group in proximity to a nitrone oxygen in residual photochemically active dye, to stabilize the optically readable datum. In an embodiment, the thus-obtained stabilized holographic data can be read using radiation having a third wavelength. In an embodiment, the read wavelength can be between 350 and 1,100 nm.

The methods disclosed herein can be used for producing holographic data storage media that can be used for bit-wise type data storage in an embodiment, and page-wise type storage of data in another embodiment. In still another embodiment, the methods can be used for storing data in multiple layers of the data storage medium. In view of the various photochemical transformations occurring with the nitrones during the data recording processes disclosed herein, it becomes possible to identify a holographic data storage medium, or a holographic data storage article comprising such a data storage medium, in terms of the chemical entities present before and after the data storage process. Thus in an embodiment, the present invention provides for a holographic data storage medium that can be used for storing data in the form of holograms. Such a data storage medium comprises (i) at least one optically transparent plastic material, and (ii) at least one photochemically active dye.

In another embodiment, the present invention provides a data storage medium comprising (i) at least one optically transparent plastic material, and (ii) at least one photochemically active dye having structure (I). In yet another embodiment, the present invention provides a data storage medium having at least one optically readable datum stored therein, the data storage medium comprising (i) at least one optically transparent plastic material, (ii) at least one photochemically active dye having structure (I), and (iii) at least one photo-stable product derived from the at least one photochemically active dye, the at least one photo-product, or combinations thereof; wherein the at least one optically readable datum is stored as a hologram in the data storage medium.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

Experimental Section

COMPARATIVE EXAMPLE 1

Comparative Example 1 illustrates the storing of a holographic data in a holographic storage medium. The following operations were performed under protection from light or under red-light conditions and under a nitrogen atmosphere.

A photochemically active dye, o-t-butoxycarbonyloxyphenyl-N-phenyl nitrone represented by structure (XVII), was first prepared. About 0.01 mol (2.13 grams) of α-(o-hydroxyphenyl)-N-phenylnitrone and about 0.025 mol (5.45 grams) of di-t-butyldicarbonate were dissolved in about 250 milliliters dry tetrahydrofuran (THF) and cooled to about 0° C. About 0.025 mol (0.6 grams) of sodium hydride were slowly added and the mixture was stirred for about 4 hours at room temperature under a nitrogen blanket. This was followed by a careful addition of water in small amounts (about 25 ml total) and the mixture was extracted with diethyl ether and water. The organic phase was dried over MgSO4, filtered, and the solvent evaporated to leave a yellow liquid that crystallized upon standing to form a light yellow crystalline solid (mp 91–93 C) which required no further purification.

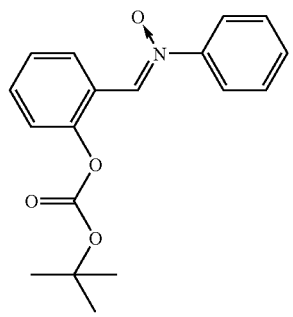

(XVII)

All handling of the compounds described is performed under protection from light or under red-light conditions. About 2 grams of optical quality poly(methyl methacrylate) (PMMA) is dissolved in about 10 milliliters of dichloromethane. About 2 milliliters of this solution are placed in an amber vial and about 5 milligrams of o-t-butoxycarbonylphenyl-N-phenyl nitrone is added and dissolved. The mixture is solvent cast onto a glass slide to form a film of about 100 micron thickness and the film is dried in air for about 2 hours and under a mild vacuum for about 24 hours. A planewave hologram is written into the dried film using a 405 nanometer write beam. Thereafter, the decay of the diffracted signal from the hologram is monitored using a 405 nanometer read beam over a time period starting at time $t_0$ and ending at time $t_1$. The intensity of the diffracted signal is recorded at both $t_0$ and $t_1$ and a percentage loss of diffracted signal (% $L_{CE-1}$) is calculated.

EXAMPLE 1

Example 1 illustrates that the lifetime of data stored in the holographic storage medium prepared as described in Comparative Example 1, is enhanced when an intramolecular hydrogen bond is formed to the nitrone oxygen by thermally converting (activating) the t-butoxycarbonyloxy group present in the photochemically active nitrone dye into a hydroxy group.

A new film sample is prepared as described in Comparative Example 1, and a hologram (optically readable datum) is written using radiation having a wavelength of 405 nanometers in a manner identical to that described previously. The film containing the written datum is then heated to about 140° C. for about 5 minutes. Thereafter, the decay of the diffracted signal from the hologram is monitored using a 405 nanometer read beam over a time period starting at time $t_0$ and ending at time $t_1$. The intensity of the diffracted signal is recorded at both $t_0$ and $t_1$ and a percentage loss of diffracted signal (% $L_{Ex-1}$) is calculated. The percentage loss of the diffracted signal in Example 1 (% $L_{Ex-1}$) is less than the percentage loss of the diffracted signal in Comparative Example-1 (% $L_{CE-1}$).

COMPARATIVE EXAMPLE 2

This comparative example illustrates the storing of a holographic data in a holographic storage medium. The following operations are performed under protection from light or under red-light conditions and under a nitrogen atmosphere.

A photochemically active nitrone dye, α-(o-nitrobenzyloxy)phenyl-N-phenylnitrone represented by structure (XVIII), is first prepared by reacting α-(o-hydroxyphenyl)-N-phenylnitrone with o-nitrobenzyl chloride using art recognized methodology for the preparation of benzyl ethers of phenolic hydroxy groups. Thus, about 0.01 mol (2.13 grams) of α-(o-hydroxyphenyl)-N-phenylnitrone and about 0.01 mol (0.054 g) of sodium methoxide are dissolved in about 250 milliliters dry THF at room temperature and stirred for 30 minutes. About 0.01 mol (1.71 grams) of 2-nitrobenzyl chloride is added and the mixture is stirred for about 30 minutes at room temperature under a nitrogen blanket. This is followed by a careful addition of water in small amounts and the mixture is extracted with diethyl ether and water. The organic phase is dried over MgSO4, concentrated and the product is purified by column chromatography to obtain α-(o-nitrobenzyloxy)phenyl-N-phenylnitrone (XVIII).

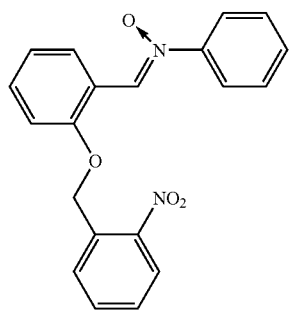

(XVIII)

All handling of the compounds described is performed under protection from light or under red-light conditions. About 2 grams of optical quality poly(methyl methacrylate) (PMMA) is dissolved in about 10 milliliters of dichloromethane. About 2 milliliters of this solution are placed in an amber vial and about 5 milligrams of α-(o-nitrobenzyloxy)phenyl-N-phenylnitrone (XVIII) is added and dissolved. The mixture is solvent cast onto a glass slide to form a film of about 100 micron thickness and the film is dried in air for about 2 hours and under a mild vacuum for about 24 hours. A planewave hologram is written into the dried film by using a 405 nanometer write beam. Thereafter, the decay of the diffracted signal from the hologram is monitored using a 405 nanometer read beam over a time period starting at time $t_0$ and ending at time $t_1$. The intensity of the diffracted signal is recorded at both $t_0$ and $t_1$ and a percentage loss of diffracted signal (% $L_{CEx-2}$) is calculated.

EXAMPLE 2

Example 2 illustrates that the lifetime of data stored in the holographic storage medium prepared as described in Comparative Example-2 is enhanced when an intramolecular hydrogen bond is present to stabilize the initially photochemically active nitrone dye.

A new film sample is prepared as described in Comparative Example-2 and a hologram is written using radiation having a wavelength of 405 nanometers in a manner identical to that used in Comparative Example-2. The film containing the written datum is exposed to short wavelength UV radiation for about 15 seconds. Thereafter, the decay of the diffracted signal from the hologram is monitored using a 405 nanometer read beam over a time period starting at time $t_0$ and ending at time $t_1$. The intensity of the diffracted signal is recorded at both $t_0$ and $t_1$ and a percentage loss of diffracted signal (% $L_{Ex-2}$) is calculated. The percentage loss of the diffracted signal in Example 2 (% $L_{Ex-2}$) is less than the percentage loss of the diffracted signal in Comparative Example-2 (% $L_{CE-2}$).

COMPARATIVE EXAMPLE-3

Comparative Example-3 illustrates the storing of a holographic data in a holographic storage medium. The following operations are performed under protection from light or under red-light conditions and under a nitrogen atmosphere.

A photochemically active dye, o-triisopropylsilyloxycarbonyloxy phenyl-N-phenyl nitrone (XIX) is first prepared. Thus, about 3.6 grams o-hydroxyphenyl-N-phenyl nitrone is dissolved in about 250 milliliters methylene chloride. To this solution is added about 2.4 grams of 2,6-lutidine, followed by dropwise addition of about 4.3 grams of triisopropylsilyl trifluoromethanesulfonate over 1 hour. The reaction mixture is then stirred under reflux for 6 hours and allowed to stir at ambient temperature overnight.

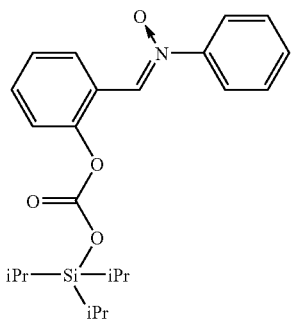

(XIX)

The solution is then concentrated on a rotary evaporator under vacuum to remove most of the methylene chloride. This mixture is added to 300 milliliters of hot, dry heptane and stirred. The hot heptane solution is decanted from the residue and allowed to cool in a nitrogen-filled bag for a 48-hour period before filtering. The product is filtered under a $N_2$ blanket and dried in a nitrogen-filled bag to yield the product protected nitrone (XIX).

All handling of the compounds described is performed under protection from light or under red-light conditions and in a nitrogen atmosphere. 2 grams of optical quality poly(methyl methacrylate) (PMMA) is dissolved in 10 milliliters of dry, degassed dichloromethane. 2 milliliters of this solution are placed in an amber vial and 5 milligrams of o-triisopropylsilyloxycarbonyl phenyl-N-phenyl nitrone is added and dissolved. The mixture is solvent cast onto a glass slide to form a film of about 100 micron thickness and the film is dried under nitrogen for 2 hours and under a mild vacuum for 24 hours. A planewave hologram is written into the dried film by using a 405 nanometer set-up. The decay of the diffracted signal from the hologram is monitored by using a 405 nanometer reading laser beam. Thereafter, the decay of the diffracted signal from the hologram is monitored using a 405 nanometer read beam over a time period starting at time $t_0$ and ending at time $t_1$. The intensity of the diffracted signal is recorded at both $t_0$ and $t_1$ and a percentage loss of diffracted signal (% $L_{CE-3}$) is calculated.

EXAMPLE 3

This Example illustrates that the lifetime of data stored in the holographic storage medium prepared as described in Comparative Example-3 is enhanced when the internal hydrogen bond formed after deprotection by exposure to atmospheric moisture.

A new film sample is prepared as described in Comparative Example-3 and a hologram is written using radiation having a wavelength of 405 nanometers in a manner identical to that described previously. The film containing the written datum is then exposed to ambient atmosphere for two hours. Thereafter, the decay of the diffracted signal from the hologram is monitored using a 405 nanometer read beam over a time period starting at time $t_0$ and ending at time $t_1$. The intensity of the diffracted signal is recorded at both $t_0$ and $t_1$ and a percentage loss of diffracted signal (% $L_{Ex-3}$) is calculated. The percentage loss of the diffracted signal in Example 3 (% $L_{Ex-3}$) is less than the percentage loss of the diffracted signal in Comparative Example-3 (% $L_{CE-3}$).

The holographic data storage methods and articles described herein above have many advantages, including, providing holographic data storage with enhanced data storage lifetime leading to greater commercial viability of such photochemically active dye based holographic storage media.

While the disclosure has been illustrated and described in typical embodiments, it is not intended to be limited to the details shown, since various modifications and substitutions can be made without departing in any way from the spirit of the present disclosure. As such, further modifications and equivalents of the disclosure herein disclosed may occur to persons skilled in the art using no more than routine experimentation, and all such modifications and equivalents are believed to be within the spirit and scope of the disclosure as defined by the following claims.

The invention claimed is:

1. A method for storing holographic data, said method comprising:

step (A) providing an optically transparent substrate comprising a photochemically active dye having structure (I)

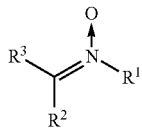

wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

wherein X is independently at each occurrence an oxygen atom, a nitrogen atom, a sulfur atom, or a selenium atom; $P^1$ is an organic protecting group, and "a" is 1 or 2;

step (B) irradiating the optically transparent substrate with a holographic interference pattern, wherein the pattern has a first wavelength and an intensity both sufficient to convert, within a volume element of the substrate, at least some of the photochemically active dye into a photo-product, and producing within the irradiated volume element concentration variations of the photo-product corresponding to the holographic interference pattern, thereby producing an optically readable datum corresponding to the volume element; and step (C) activating the optically transparent substrate to form an intramolecular hydrogen bond to a nitrone oxygen in residual photochemically active nitrone dye, to stabilize the optically readable datum.

2. The method of claim 1, wherein said step of activating comprises photo-activating the residual photochemically active nitrone dye at a second wavelength and an intensity sufficient to form a protonated nitrone with an intramolecular hydrogen bond.

3. The method of claim 1, wherein said step of activating comprises thermally activating the residual photochemically active nitrone dye at thermal energies sufficient to form a protonated nitrone with an intramolecular hydrogen bond.

4. The method of claim 1, wherein said step of activating comprises exposing the residual photochemically active nitrone dye to moisture in an amount sufficient to form a protonated nitrone with an intramolecular hydrogen bond.

5. The method of claim 1, wherein said step of activating comprises exposing the residual photochemically active dye to oxygen in an amounts sufficient to form a protonated nitrone with an intramolecular hydrogen bond.

6. The method of claim 1, wherein the optically transparent substrate is a polycarbonate.

7. The method of claim 1, wherein the photochemically active dye is a nitrone having a structure (II)

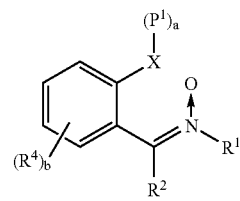

wherein $R^1$ is a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; and "b" is an integer from 0 to 4 inclusive.

8. The method of claim 1, wherein the photochemically active dye is a nitrone having a structure (III)

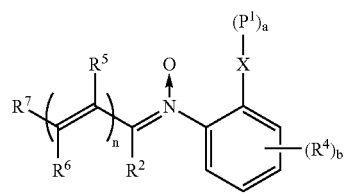

wherein $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; "b" is an integer from 0 to 4 inclusive; $R^5$, $R^6$, and $R^7$ are independently at each occurrence, hydrogen, halogen, a $C_1$–$C_{30}$ aliphatic radical, a $C_3$–$C_{30}$ cycloaliphatic radical, or a $C_2$–$C_{30}$ aromatic radical; and "n" is an integer from 0 to 4 inclusive.

9. The method of claim 1, wherein the photochemically active dye is an aromatic nitrone selected from the group consisting of ortho-(tert-butoxycarbonyloxy)phenyl-N-phenyl nitrone, ortho-(2-nitrobenzyloxy)phenyl-N-phenylnitrone, ortho-(triisopropylsilyloxycarbonyloxy)phenyl-N-phenyl nitrone, and combinations thereof.

10. The method of claim 1, wherein the photo-product is an oxaziridine.

11. The method of claim 1, wherein the photo-product is an aromatic oxaziridine.

12. The method of claim 11, wherein the aromatic oxaziridine has a structure (IV)

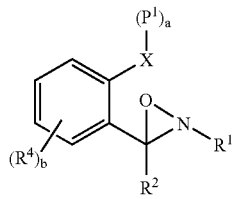

IV wherein $R^1$ is a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; and "b" is an integer from 0 to 4 inclusive.

13. The method of claim 11, wherein the aromatic oxaziridine has a structure (V)

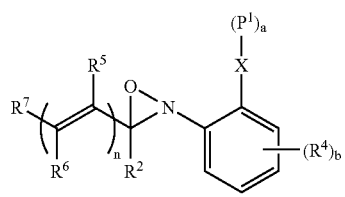

V wherein $R^2$ is hydrogen, a $C_1$–$C_{30}$ aliphatic radical, a $C_3$–$C_{30}$ cycloaliphatic radical, or a $C_2$–$C_{30}$ aromatic radical; X is an oxygen atom, a nitrogen atom, a sulfur atom, or a selenium atom; $P^1$ is an organic protecting group; "a" is 1 or 2; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; "b" is an integer from 0 to 4 inclusive; $R^5$, $R^6$, and $R^7$ are independently at each occurrence, hydrogen, halogen, a $C_1$–$C_{30}$ aliphatic radical, a $C_3$–$C_{30}$ cycloaliphatic radical, or a $C_2$–$C_{30}$ aromatic radical; and "n" is an integer from 0 to 4 inclusive.

14. The method of claim 1, wherein said first wavelength is from about 375 nanometers to about 450 nanometers.

15. The method of claim 1, wherein said first wavelength is from about 450 nanometers to about 550 nanometers.

16. The method of claim 2, wherein said second wavelength is longer than the first wavelength, and the second wavelength is from about 450 nanometers to about 1500 nanometers.

17. The method of claim 2, wherein said second wavelength is longer than the first wavelength, and the second wavelength is from about 550 nanometers to about 1500 nanometers.

18. The method of claim 2, wherein said second wavelength is shorter than the first wavelength, and the second wavelength is from about 10 nanometers to about 400 nanometers.

19. A method for storing holographic data, said method comprising:

step (A) providing an optically transparent substrate comprising a photochemically active nitrone having structure (VI)

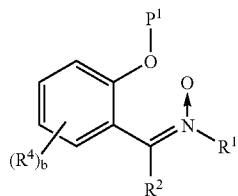

VI wherein $R^1$ is a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; $P^1$ is an organic protecting group; $R^4$ is a halogen, nitro, hydroxy, a $C_1$–$C_{30}$ aliphatic radical, a $C_3$–$C_{30}$ cycloaliphatic radical, or a $C_2$–$C_{30}$ aromatic radical; and "b" is an integer from 0 to 4 inclusive;

step (B) irradiating the optically transparent substrate with a holographic interference pattern, wherein the pattern has a first wavelength and an intensity both sufficient to convert, within a volume element of the substrate, at least some of the photochemically active nitrone into a photo-product of the photochemically active nitrone, and producing within the irradiated volume element concentration variations of the photo-product corresponding to the holographic interference pattern, thereby producing a first optically readable datum corresponding to the volume element; and step (C) activating the optically transparent substrate to form an intramolecular hydrogen bond to a nitrone oxygen in residual photochemically active nitrone dye, to stabilize the optically readable datum.

20. An optical writing/reading method, comprising:

step (A) irradiating with a holographic interference pattern an optically transparent substrate that comprises a photochemically active dye having structure (I)

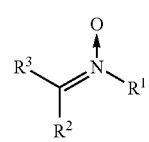

I wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

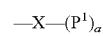

—X—$(P^1)_a$ wherein X is independently at each occurrence an oxygen atom, a nitrogen atom, a sulfur atom, or a selenium atom; $P^1$ is an organic protecting group, and "a" is 1 or 2;

wherein the pattern has a first wavelength and an intensity both sufficient to convert, within a volume element of the substrate, at least some of the photochemically active dye into a photo-product, and producing within the irradiated volume element concentration variations of the photo-product corresponding to the holographic interference pattern, thereby producing a first optically readable datum corresponding to the volume element; wherein the holographic interference pattern is produced by simultaneously irradiating the optically transparent substrate with two interfering beams at the first wavelength;

step (B) activating the optically transparent substrate to form an intramolecular hydrogen bond to a nitrone oxygen in residual photochemically active nitrone dye, to stabilize the optically readable datum; and step (C) irradiating the optically transparent substrate with a read beam and reading the optically readable datum by detecting diffracted light.

21. The method of claim 20, wherein the two interfering beams comprise a signal beam corresponding to data and a reference beam that does not correspond to data.

22. The method of claim 20, wherein the read beam has a wavelength that is shifted by 0 nanometer to about 400 nanometers from the signal beam's wavelength.

23. The method of claim 20, wherein the first wavelength, the second wavelength and the read beam all have different wavelengths.

24. A data storage medium comprising:
an optically transparent plastic material; and
a photochemically active dye having structure (I)

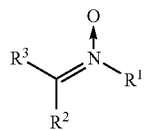

I wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

wherein X is independently at each occurrence an oxygen atom, a nitrogen atom, a sulfur atom, or a selenium atom; $P^1$ is an organic protecting group, and "a" is 1 or 2.

25. A data storage medium having at least one optically readable datum stored therein, the data storage medium comprising:
an optically transparent plastic material;
a photochemically active dye having structure (I)

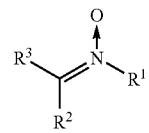

I wherein $R^1$ and $R^3$ are independently a $C_1$–$C_{30}$ aliphatic radical, a $C_3$–$C_{30}$ cycloaliphatic radical, or a $C_2$–$C_{30}$ aromatic radical; $R^2$ is hydrogen, a $C_1$–$C_{30}$ aliphatic radical, a $C_3$–$C_{30}$ cycloaliphatic radical, or a $C_2$–$C_{30}$ aromatic radical; and at least one of the groups $R^1$ and $R^3$ comprises in proximity to the nitrone oxygen, a group

wherein X is independently at each occurrence an oxygen atom, a nitrogen atom, a sulfur atom, or a selenium atom; $P^1$ is an organic protecting group, and "a" is 1 or 2;
a photo-product derived from the photochemically active dye; and
a photo-stable product derived from the photochemically active dye, the photoproduct, or combinations thereof;
wherein the optically readable datum is stored as a hologram patterned within at least one volume element of the optically transparent substrate.

* * * * *